US007327616B2

(12) United States Patent
Kameda et al.

(10) Patent No.: US 7,327,616 B2
(45) Date of Patent: Feb. 5, 2008

(54) NON-VOLATILE SEMICONDUCTOR MEMORY DEVICE

(75) Inventors: Yasushi Kameda, Yokosuka (JP); Ken Takeuchi, Yokohama (JP); Hitoshi Shiga, Yokohama (JP); Takuya Futatsuyama, Yokohama (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/235,206

(22) Filed: Sep. 27, 2005

(65) Prior Publication Data

US 2006/0087887 A1    Apr. 27, 2006

(30) Foreign Application Priority Data

Sep. 30, 2004 (JP) ............................ 2004-288449

(51) Int. Cl.
*G11C 5/14* (2006.01)
(52) U.S. Cl. ............................ 365/189.09; 365/185.18
(58) Field of Classification Search ............ 365/49, 365/189.09
See application file for complete search history.

(56) References Cited

U.S. PATENT DOCUMENTS

| 5,150,325 | A | * | 9/1992 | Yanagisawa et al. ....... 365/177 |
| 5,453,955 | A |   | 9/1995 | Sakui et al. |
| 5,459,694 | A | * | 10/1995 | Arakawa ................ 365/185.21 |
| 5,802,602 | A | * | 9/1998 | Rahman et al. ............. 711/204 |
| 2003/0117856 | A1 | * | 6/2003 | Lee et al. ............... 365/189.05 |
| 2004/0213045 | A1 | * | 10/2004 | Nakai .................... 365/185.13 |
| 2006/0087887 | A1 |   | 4/2006 | Kameda et al. |

FOREIGN PATENT DOCUMENTS

| JP | 4-276393 | 10/1992 |
| JP | 09-35486 | * 7/1995 |
| JP | 08-147990 | * 11/1995 |
| JP | 8-147990 | 6/1996 |
| JP | 9-35486 | 2/1997 |

OTHER PUBLICATIONS

U.S. Appl. No. 11/235,206, filed Sep. 27, 2005, Kameda et al.
U.S. Appl. No. 11/240,510, filed Oct. 3, 2005, Nagashima.
U.S. Appl. No. 11/409,043, filed Apr. 24, 2006, Takeuchi.

* cited by examiner

*Primary Examiner*—Amir Zarabian
*Assistant Examiner*—Jason Lappas
(74) *Attorney, Agent, or Firm*—Oblon, Spivak, McClelland, Maier & Neustadt, P.C.

(57) ABSTRACT

The non-volatile semiconductor memory device has a circuit which maintains and holds the potentials of bit lines, and either ones of even-bit lines or odd-bit lines are connected to the circuit. When the bit line potential holding circuit is connected to even-bit lines and a block copy is performed, data is first outputted to the even-bit lines, and after the potential of the even-bit line is determined, the bit line potential holding circuit operates. Then, biasing of the potential of the even-bit lines is carried out by the bit line potential holding circuit, the potentials of the bit lines are maintained and held. At the same time, data is outputted to the odd-bit lines and the potentials of the odd-bit lines are determined. Then, a program voltage is supplied to a selected word line, and data is simultaneously written (programmed) in the memory cells connected to the even-bit lines, and the memory cells connected to the odd-bit lines.

18 Claims, 14 Drawing Sheets

NON-VOLATILE SEMICONDUCTOR MEMORY DEVICE

CROSS-REFERENCE TO RELATED APPLICATIONS

This application is based upon and claims the benefit of priority from the prior Japanese Patent Applications No. 2004-288449, filed on Sep. 30, 2004, the entire contents of which are incorporated herein by reference.

BACKGROUND OF THE INVENTION

This invention relates to an electrically rewritable non-volatile semiconductor memory device. More specifically, it is related to a non-volatile semiconductor memory device with a NAND type flash memory.

Description of Related Art

In recent years, the demand of non-volatile semiconductor memory devices which are small size and large scale is increasing rapidly. NAND type flash memories which can expect high integration and large scale-ization especially as compared with conventional NOR type flash memories have attracted attention.

NAND type flash memories have an advantage that high integration and large scale-ization are realizable, because of its circuit configuration. On the other hand, when erasing data, they are necessary to carry out block by block. For this reason, even if it is a case where the data of some memory cells should be erased, it is needed to erase the whole blocks containing that memory cells. Therefore, before performing an erase operation, it is necessary to copy required data from the block to be erased to other blocks (copy operation of the data is hereafter called "block copy".). The time needed for the block copy before the erase operation renders bottleneck, In recent years, a market demand for NAND flash memories with improved speed is increasing, and the demand for a block copy with improved speed is also increasing especially.

Kokai H09-35486 shows a flash memory for performing read operation and verify-operations by dividing into even-bit lines and odd-bit lines, and for performing program operation simultaneously to even-bit lines and odd-bit lines.

Moreover, Kokai H08-147990 shows a flash memory for sequentially performing read operation by connecting two or more global data lines to a corresponding sense latch one by one and for performing write-in operation and erase operation in parallel using plural sense latches.

SUMMARY OF THE INVENTION

Then, this invention is made in view of an above-mentioned problem.

It is the purpose of this invention to provide a non-volatile semiconductor memory device comprising: a first bit line connected to a first memory cell; a second bit line connected to a second memory cell, the second bit line being adjacent to said first bit line; a bit line shielding circuit, for providing a predetermined shield potential to said second bit line when said first memory cell connected to said first bit line is sensed and for providing said predetermined shield potential to said first bit line when said second memory cell connected to said second bit line is sensed; a data cache circuit for sequentially providing a first data to said first bit line and a second data to said second bit line; a bit line potential holding circuit for holding said first data provided to said first bit line; and a program circuit for simultaneously programming said first memory cell and said second memory cell while said bit line potential holding circuit holds said first data provided to said first bit line and while the data cache is providing the second data to said second bit line.

DETAILED DESCRIPTION OF THE PREFERRED EMBODIMENT

Figure 1:
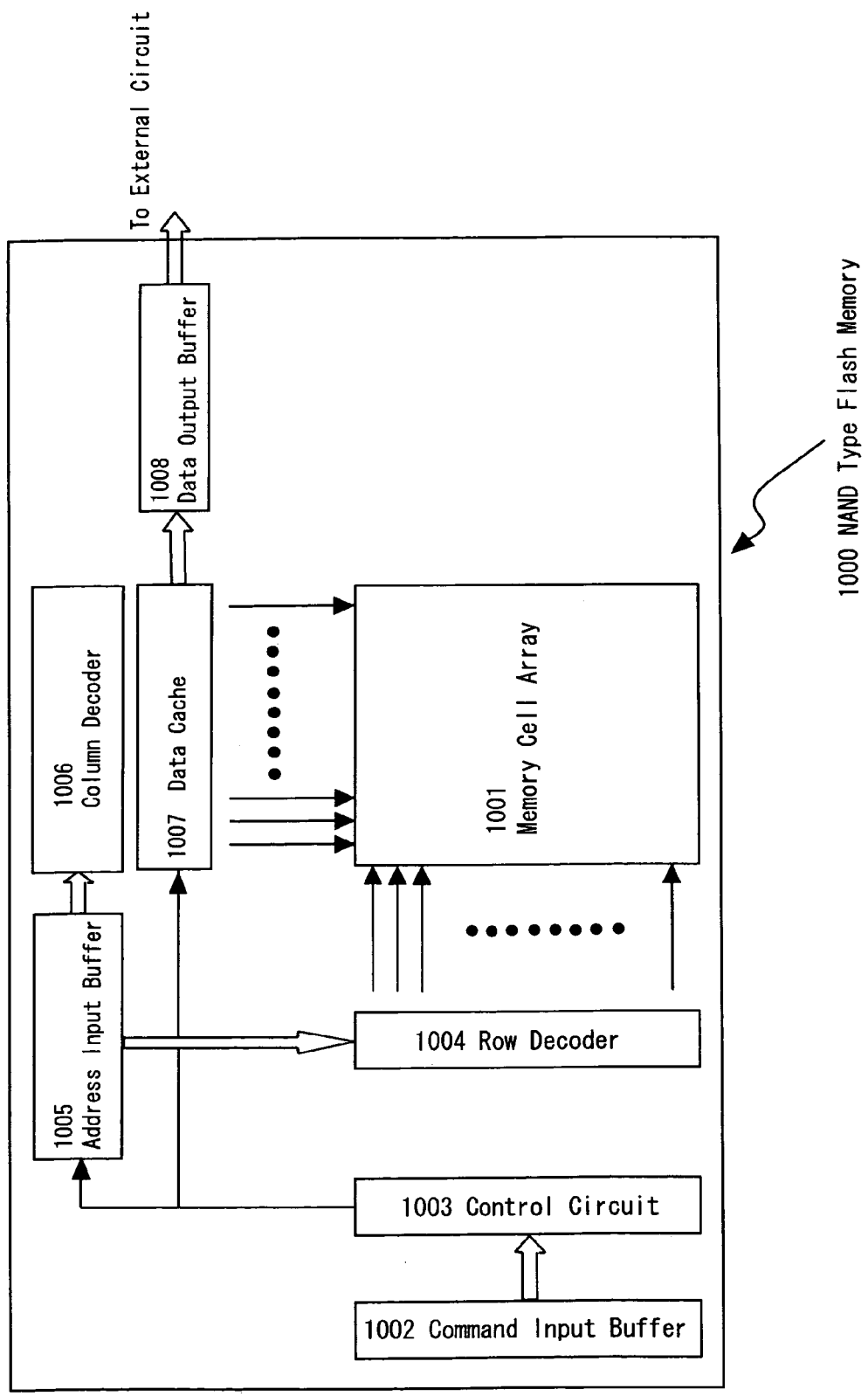
FIG. 1 is an outline configuration of the NAND type flash memory.

Here, the configuration of the NAND flash memory is explained. FIG. 1 is referred to. The outline configuration figure of the NAND flash memory 1000 is shown in FIG. 1. 1001 is a memory cell array, 1002 is a command input buffer, 1003 is a control circuit, 1004 is a row decoder and 1005 is an address input buffer. 1006 is a column decoder, 1007 is a data cache consisting of sense amplifiers and latches, and 1008 are data output buffers. The command input from the exterior is inputted into the control-circuit 1003 through the command input buffer 1002. The control circuit 1003 outputs address information to the address input buffer 1005, and the address input buffer 1005 outputs the access information of memory cells to a row decoder 1004 and the column decoder 1006. The row decoder 1004 and the column decoder 1006 activate applicable memory cells based on said access information. The data cache 1007 connected to bit lines of the memory cell array detects the potentials of bit lines using a sense amplifiers, retains the potentials by latches, and outputs the potentials to a data output buffer 1008. The data output buffer 1008 outputs data to an external circuit.

Figure 2:
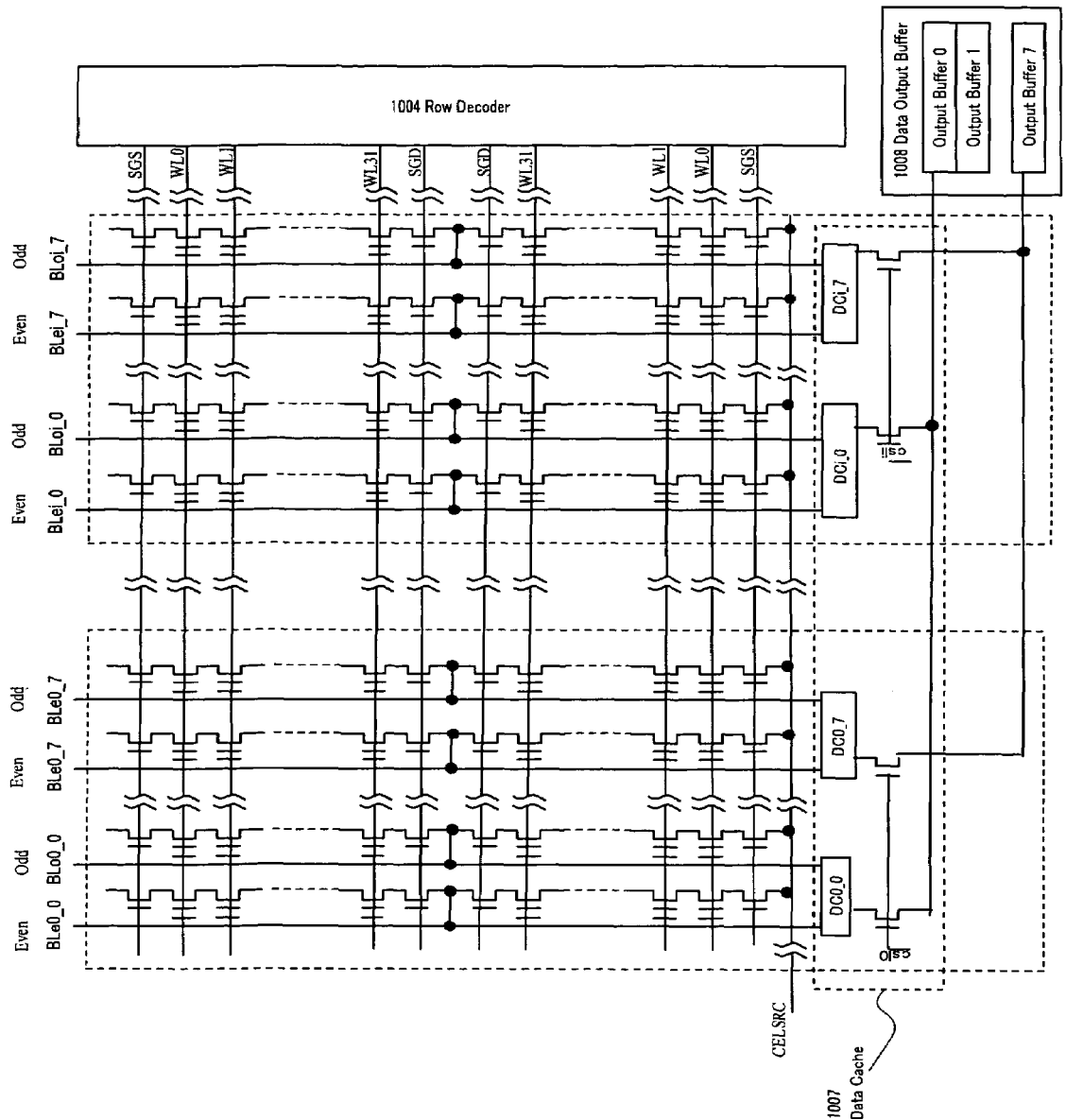
FIG. 2 is an outline circuit diagram of peripheral circuit for the memory cell array of the NAND type flash memory.

The outline configuration figure of the memory cell array 1001, the row decoder 1004, the data cache 1007, and the data output buffer 1008 is shown in FIG. 2. In the NAND type flash memory as shown in FIG. 2, the data cache (DC) includes sense amplifiers (S/A) and latch circuits for every pair of even-bit lines and odd-bit lines (for example, BLe0_0 and BLo0_0). Therefore, in order to make the consumption current of S/A small, the "voltage sense system" which detects the electric charges of bit lines is adopted.

Figure 3:
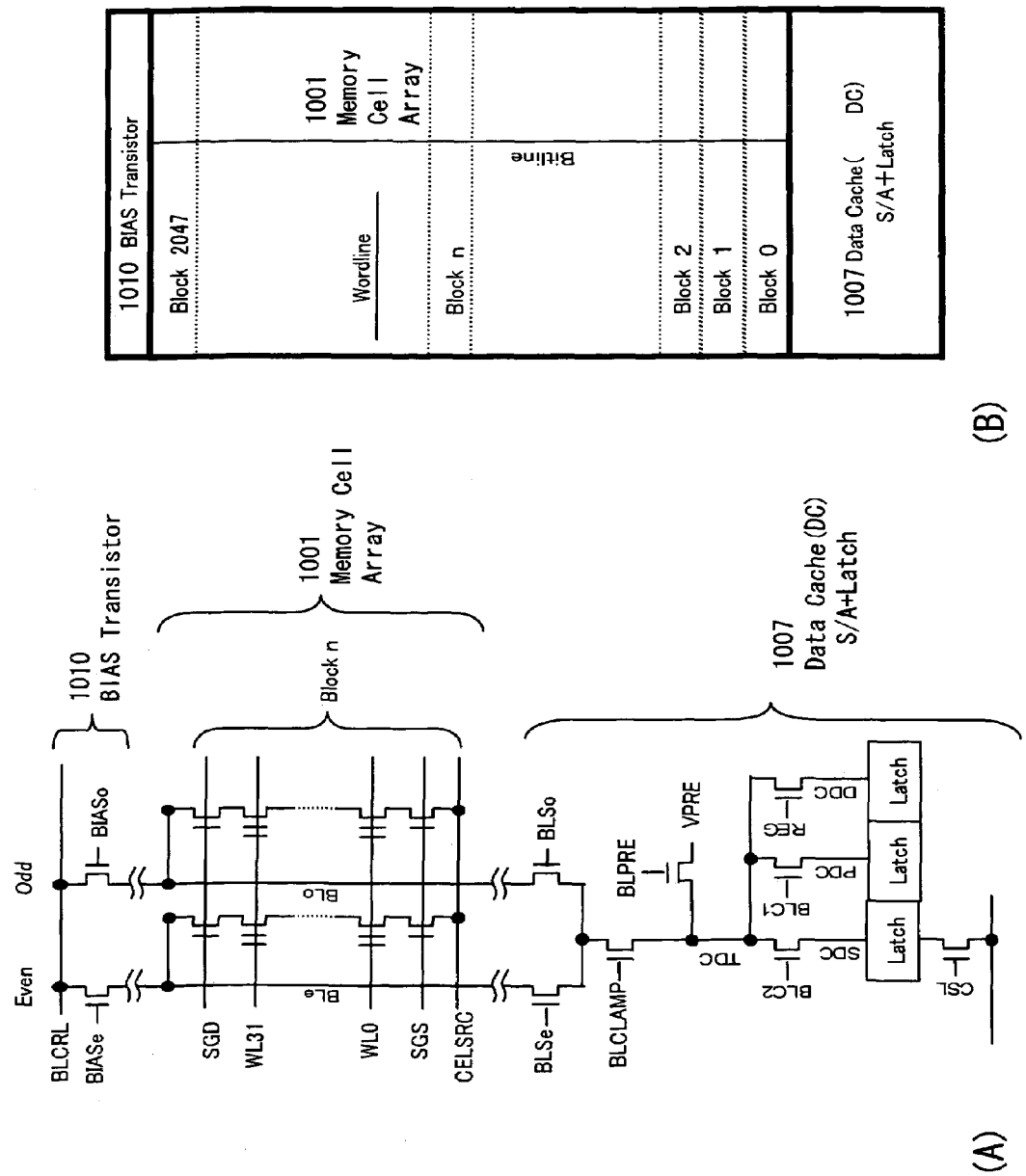
FIG. 3 is (A) circuit diagram and (B) circuit block diagram of the periphery of memory cell array of the NAND type flash memory.

The circuit configuration with a detailed NAND type flash memory of the voltage sense system is shown in FIG. 3. In the data cache circuit (DC) 1007, sense amplifiers and latch circuits (Latch) are combined as shown in FIG. 3. As shown in FIG. 3, in the NAND type flash memory of the conventional voltage sense system, the electric charges are beforehand stored in the bit lines (pre-charge). (1) If a NAND memory cell turns on, the pre-charged electric charges may fall out through the NAND memory cell, and the potential of the bit line is set to VSS (discharge). (2) If a NAND memory cell does not turn on, the pre-charged electric charges are not drawn out and the potential of the bit line is maintained. In this case, the bit line is floating. To the timing when the above discharge ended, a sense amplifier detects the voltage level of the bit line.

By the way, in a flash memory, bit line intervals are shortened and adjacent capacitances of bit lines become large as a chip shrink progresses. These days, the adjacent bit line capacitances have attained to 80% of the whole amount of bit line capacitances. With large-scale-izing of a flash memory, the chip-shrink progresses increasingly and it continues to be thought that an adjacent bit line capacitances become larger.

When the bit line adjacent to the bit line of a floating state in the above-mentioned state of (2) (state which the NAND memory cell does not turn on) is discharged as of (1), the large adjacent bit line capacitances make the potentials of the floating bit line also falls. This phenomenon is called "coupling" phenomenon. Usually, the potentials of bit lines are maintained at the pre-charged level in the above-mentioned state of (2). However, the potentials of bit lines will fall under the influence of coupling, and incorrect sensing will be caused. Therefore, this may make exact read operation impossible. In order to avoid the incorrect sensing under the influence of this coupling, these days, the technique for shielding adjacent bit lines is adopted.

In the technique for shielding these adjacent bit lines, one sense amplifier circuit is shared by two bit lines as shown in FIG. 3. That is, adjacent bit lines were classified into even number (Even) and odd number (Odd), and the adjacent bit lines of even number (Even) and odd number (Odd) have a configuration to share one sense amplifier.

In a read operation, and in reading the data of the even (Even) bit line, the transfer gate (BLSe) for the even-bit line is turned on, and it connects the even-bit line to the sense amplifier. At this time, the odd-bit line is made into grounding potential (VSS) by turning on the transistor (BIASo) for grounding. On the other hand, in reading the data of the odd number (Odd) bit line, the transfer gate (BLSo) for odd-bit lines is turned on, and it connects the odd-bit line to a sense amplifier. At this time, an even-bit line is set into grounding potential (VSS) with the transistor (BIASe) for grounding. Thus, it becomes possible to reduce the influence from a signal on the adjacent-bit-lines by setting adjacent non-selected bit lines into ground during read operation.

Moreover, in a block copy performed before an erase operation, adjacent bit lines are classified into Even/Odd and the Even/Odd bit lines in the same block are assigned to the Even/Odd bit lines of a different page, respectively.

In addition, since wells for the adjacent memory cells are completely inseparable electrically, an erase operation is performed by unit for both of these Even/Odd bit lines at the time of an erase operation (erase operation in a block unit). Therefore, in the case of the block copy performed before an erase operation, copies of the pages of both of Even/Odd are required. The flow chart of this block copy operation is shown in FIG. 4.

Figure 4:
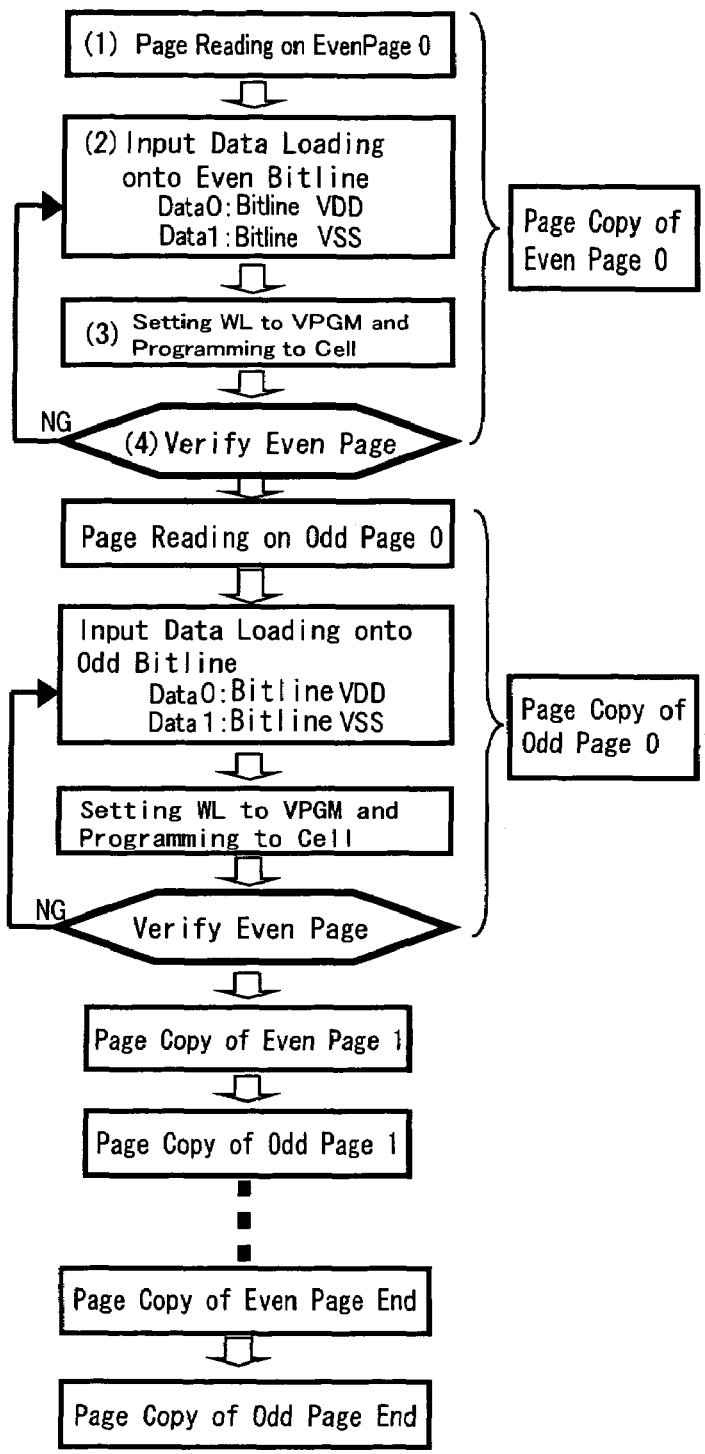
FIG. 4 is a flow chart of block copy operation of the NAND type flash memory.

The page copy of Even Page0 is first performed as shown in FIG. 4. In the page copy of Even Page0, (1) page read of Even Page0 is performed first. Next, (2) data is outputted onto Even bit lines (loading). When data is "0", the potential of the Even bit lines will be VDD. On the other hand, when data is "1", the potential of the Even bit lines will be VSS. Next, (3) a program voltage (VPGM) is supplied to a selected word line WL of the memory cells into which data copy is performed, and data is written in the above memory cells. And (4) verification operation of Even Page0 is performed. If the program is not completed, it returns to operation of (2), and if it has completed, the page copy of Even Page0 will be completed.

Next, the page copy of Odd Page0 is performed in a similar manner to the page copy of Even Page0. The end of the page copy of Odd Page0 will terminate the page copy of whole Page0. Then, the page copies from Page1 (Even Page1 and Odd Page1) to Page End (Even PageEnd and Odd PageEnd) are performed sequentially. Thus, a block copy is performed.

Figure 5:
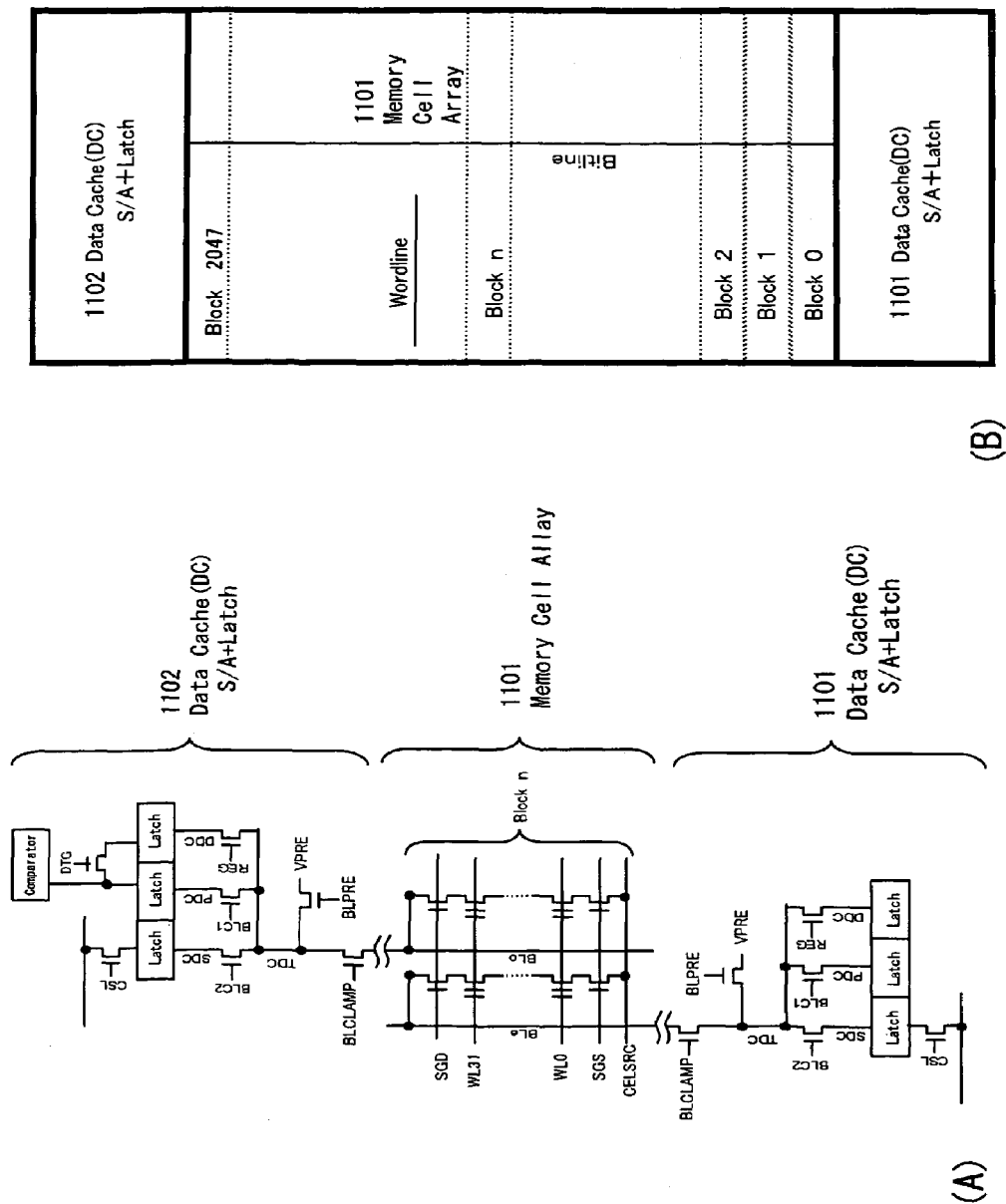
FIG. 5 is (A) circuit diagram and (B) circuit block diagram of the periphery of the memory cell array of the NAND type flash memory.

FIG. 5 shows a NAND flash memory with a configuration which arranges data caches at the both sides of bit lines for a method of writing the page of both of Even/Odd simultaneously. In the NAND type flash memory shown in FIG. 5, in order not to be influenced by adjacent bit lines, the potential of a bit line is detected, sending current so that a bit line may not become floating. This is called "current sense system." In the NAND type flash memory using the current sense system shown in FIG. 5, it becomes possible to perform a read operation and write-in operation to both of Even/Odd simultaneously, and thereby accelerating a block copy.

Figure 6:
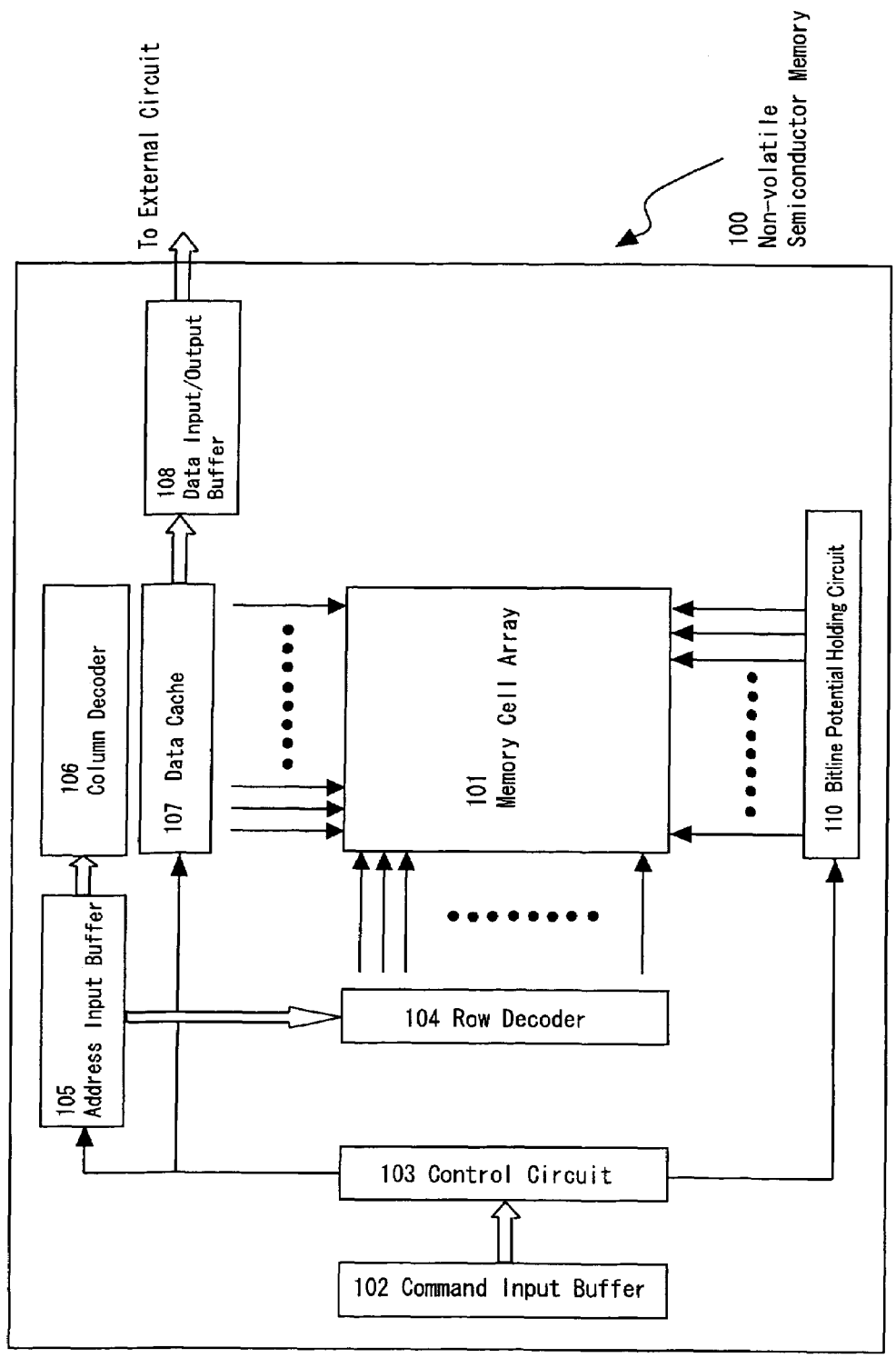
FIG. 6 is an outline configuration of the non-volatile semiconductor memory device according to one embodiment of this invention.

The outlined configuration of the non-volatile semiconductor memory device 100 which is one embodiment of the non-volatile semiconductor memory device of this invention is shown in FIG. 6. The non-volatile semiconductor memory device 100 according to this embodiment has a memory cell array 101, a command input buffer 102, a control circuit 103, a row decoder 104, an address input buffer 105, a column decoder 106, a data cache 107 having sense amplifiers and latches, a data output buffer 108, and a bit line potential holding circuit 110.

In the non-volatile semiconductor memory device 100 of this embodiment, the command inputted from the exterior is inputted into the control circuit 103 through the command input buffer 102. The control circuit 103 controls operation of the address input buffer 105, the data cache 107, and the bit line potential holding circuit 110. The control circuit 103 outputs address information to the address input buffer 105, and the address input buffer 105 outputs the access information of memory cells to a row decoder 104 and the column decoder 106. The row decoder 104 and the column decoder 106 activate the memory cells, thereby performing reading, programming, or erasure of data based on the above access information. The data cache 107 connected to each of the bit lines of the memory cell array detects the potentials of bit lines with sense amplifiers, and retains them by latches. The data cache 107 loads data to bit lines. The bit line potential holding circuit 110 is connected to the even-bit lines of the memory cell array. The potentials of even-bit lines are retained and held. The data output buffer 108 outputs the data from the data cache 107 to an external circuit.

Although the bit line potential holding circuit 110 is connected to the even-bit lines of the memory cell array in the non-volatile semiconductor memory device 100 of this embodiment, it could be connected to the odd-bit lines.

Figure 7:
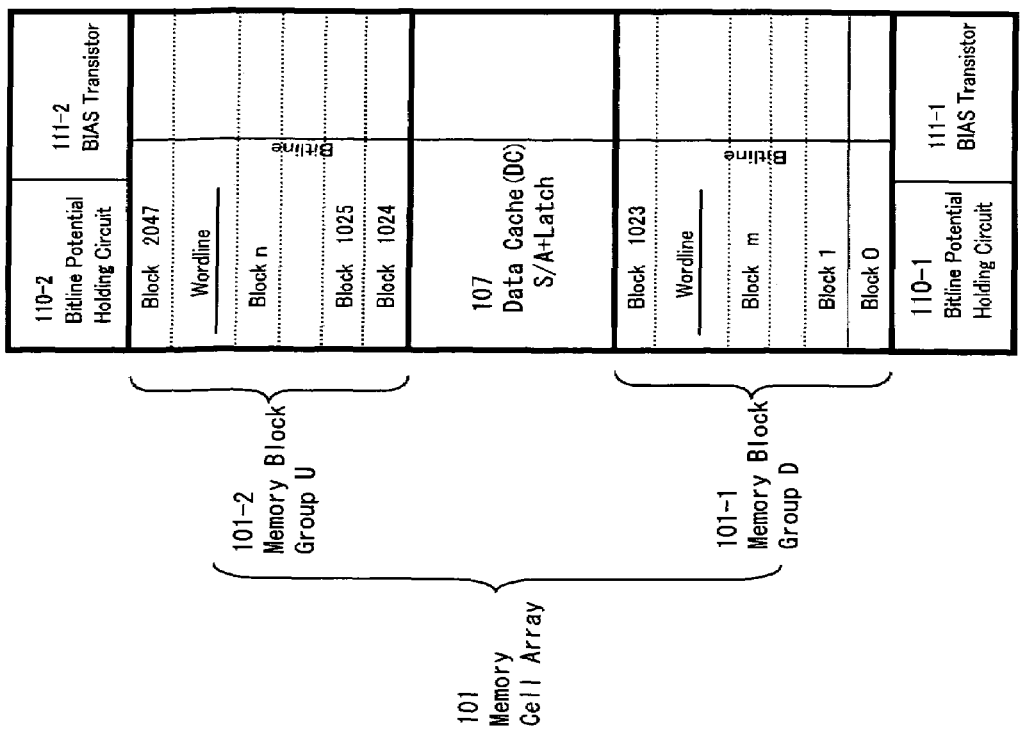
FIG. 7 is a circuit block diagram of the periphery of the memory cell array of the non-volatile semiconductor memory device according to one embodiment of this invention.
Figure 8:
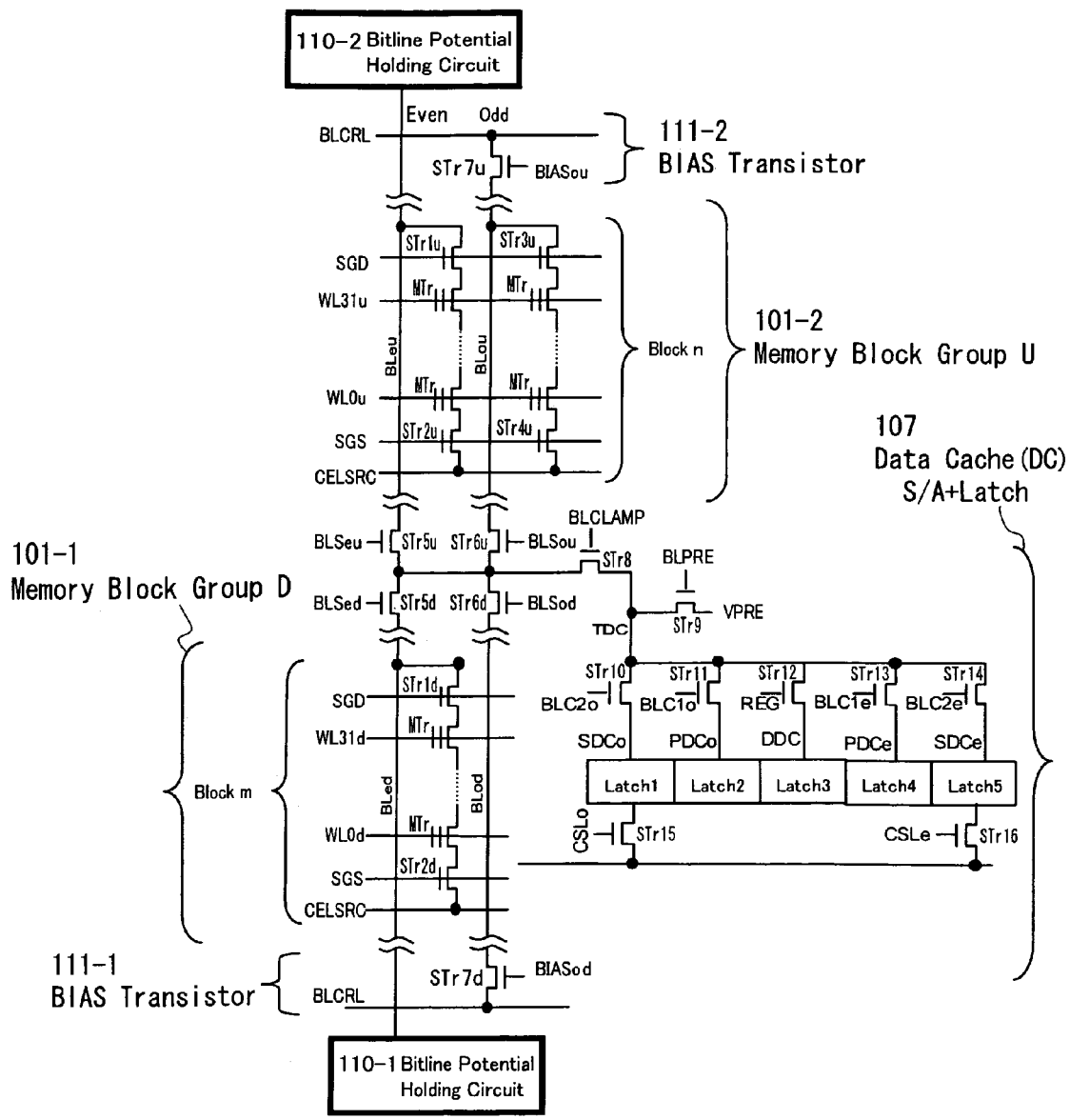
FIG. 8 is circuit diagrams of the memory cell array 101, the data cache 107, the bit line potential holding circuit 110-1, 110-2, the BIAS transistor 111-1, 111-2 of the non-volatile semiconductor memory device according to one embodiment of this invention.
Figure 9:
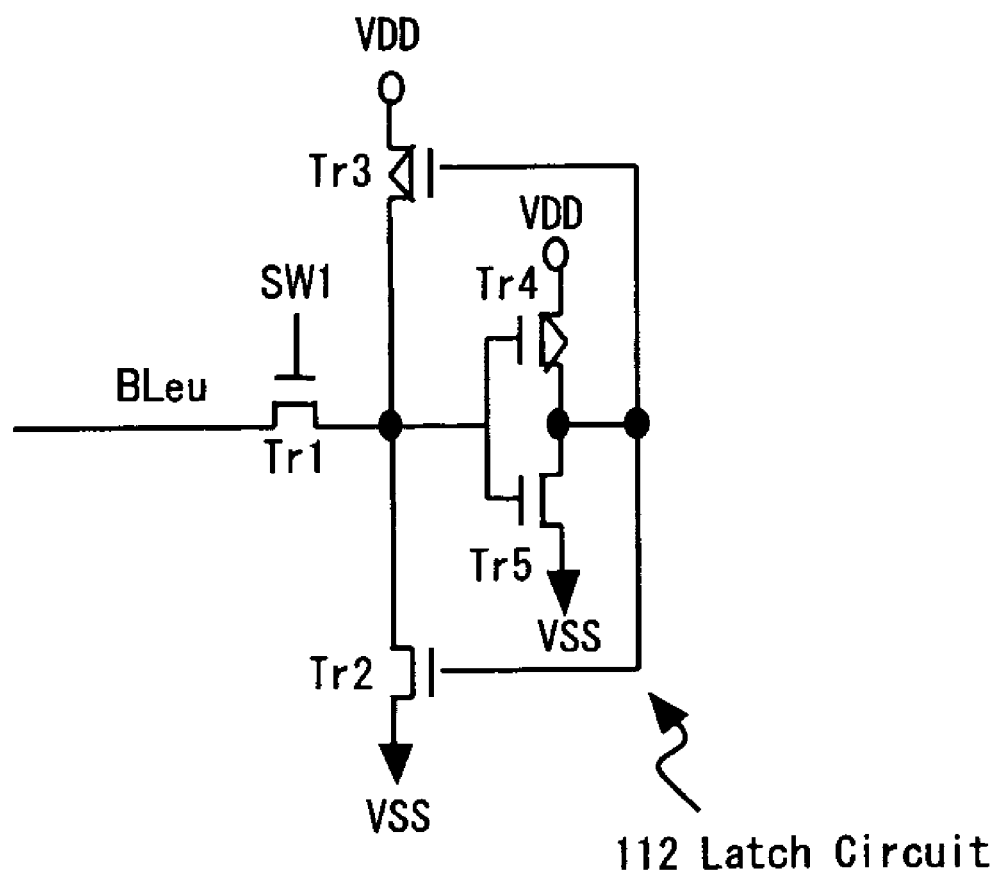
FIG. 9 is a circuit diagram of the bit line potential holding circuit of the non-volatile semiconductor memory device according to one embodiment of this invention.

Next, with reference to FIGS. 7, 8, and 9, the circuit configuration of peripheral of the memory cell array 101 in the non-volatile semiconductor memory device 100 according to this embodiment is explained in detail.

The circuit block diagram of the memory cell array 101, the data cache 107, the bit line potential holding circuit 110, and the bias transistor (BIAS transistor) 111 connected to the odd-bit lines are shown in FIG. 7. The memory cell array 101 of the non-volatile semiconductor memory device 100 according to this embodiment has a memory block group D (memory block group Down) 101-1 consisting of block 0-block 1023 as shown in FIG. 7. Furthermore, the memory cell array 101 has memory block group U (memory block group Up) 101-2 consisting of block 1024-block 2047. In one memory block, string length of the NAND memory cell is of 32 (WL0-WL31), and page length (the number of bit lines) is of 2 K bytes. The number of memory blocks, the string length and page length of the NAND memory cell of the non-volatile semiconductor memory device 100 according to this embodiment of this invention are not necessarily limited to the above number of this embodiment, but can be changed according to a desired storage capacity.

In this embodiment, the memory block group D101-1 and the memory block group U101-2 share one data cache 107. In other words, they have one data cache 107 in the central part of bit lines. With this configuration, the capacitances of the bit lines are halved as compared with ones of the conventional example which arranges the data cache to the both ends of bit lines. The data cache may be formed only in one end of bit lines, or may be formed in the both sides of bit lines.

The non-volatile semiconductor memory device 100 of this embodiment has the bit line potential holding circuit 110 (110-1 and 110-2) as shown in FIG. 7. The bit line potential holding circuit 110-1 and 110-2 are connected to the ends of the even-bit lines of the memory cell block group 101-1 and the memory cell block group 101-2, respectively. The non-volatile semiconductor memory device 100 of this embodiment has the BIAS transistors (bias transistors) 111-1 and 111-2. The BIAS transistors 111-1 and 111-2 are connected to the ends of the odd-bit lines of the memory cell block group 101-1 and the memory cell block group 101-2, respectively.

In the non-volatile semiconductor memory device 100 of this embodiment, two block groups (memory block group D101-1 and memory block group U101-2) which consist of memory cells are sharing one data cache 107. Therefore, the bit line potential holding circuit 110-1 and 110-2 are arranged at the both ends of bit lines for the necessity in circuit layout arrangement, respectively. As long as there is no problem of a circuit layout restrictions, one bit line potential holding circuit can be arranged at the central part of bit lines, and two block groups (Memory block group D101-1 and memory block group U101-2) consisting of memory cells share one bit line potential holding circuit like the data cache 107. Moreover, the data cache can be formed only in one end of bit lines, and the bit line potential holding circuit can be in the same or opposite side. Thus, the number and the arrangement of a data cache and bit line potential holding circuits can be changed according to the capacity of a memory cell array and the layout arrangement.

Next, FIGS. 8 and 9 are referred to. FIG. 8 shows circuit diagrams of the memory cell array 101, the data cache 107, the bit line potential holding circuit 110-1, 110-2, and the BIAS transistor 111-1, 111-2 of this embodiment. The bit line potential holding circuit 110-1 of this embodiment and the circuit diagram of 110-2 are shown in FIG. 9. In FIG. 8, because of drawing restriction, the circuit configuration of a pair of an even-bit line and an odd-bit line is illustrated. Moreover, the circuit configuration of the block m (only one circuit connected to an even-bit line) of memory block group D101-1 and the block n of memory block group U101-2 are shown. Because of drawing restriction, only the circuit connected to the even-bit line of the block m of memory block group D101-1 is shown. The circuit connected to the odd-bit line is the same as the circuit connected to the even-bit line.

In the memory block n, one end of the string (NAND memory string) of 32 memory transistors (MTr) connected in series is connected to the even-bit line BLeu through selection gate transistor STr1u as shown in FIG. 8. The other end of the string of the 32 memory transistors (MTr) is connected to the source line CELSRC through selection gate transistor STr2u. Word lines WL0u-WL31u are connected to these 32 control gate electrodes of the memory transistors (MTr), respectively. The gate electrodes of selection gate transistors STr1u and STr2u are connected to the selection gate lines SGD and SGS and respectively. One end of the even-bit line BLeu is connected to the bit line potential holding circuit 110-2, and the other end is connected to the even-bit line BLed of memory block group D101-1 through a bit line selection transistor STr5u.

In the memory block n, the end of the string (NAND memory string) of 32 memory transistors (MTr) connected in series is connected to the odd-bit line Blou through a selection gate transistor STr3u as shown in FIG. 8. The other end of the string of 32 memory transistors (MTr) is connected to the source line CELSRC through selection gate transistor STr4u. Word lines WL0u-WL 31u are connected to these 32 control gate electrodes of memory transistors (MTr), respectively. The gate electrodes of selection gate transistors STr3u and STr4u are connected to the selection gate lines SGD and SGS, respectively. The end of the odd-bit line Blou is connected to the bit line shield power supply (BLCRL) through BIAS transistor STr7u. The other end is connected to the odd-bit line BLod of the memory block group D101-1 through the bit line selection transistor STr6u.

For the memory block m as well as for the memory block n, the configuration with which the NAND memory strings are connected to the even-bit line BLed and the odd-bit line BLod, respectively is taken as shown in FIG. 8. The end of the even-bit line BLed is connected to the bit line potential holding circuit 110-1. The other end is connected to the even-bit line BLeu of the memory block group D101-1 through the bit line selection transistor STr5d. The end of the odd-bit line BLod is connected to the bit line shield power supply (BLCRL) through the BIAS transistor STr7d. The other end is connected to the odd-bit line BLou of the memory block group D101-2 through the bit line selection transistor STr6d.

The data cache circuit 107 has transistors STr8-STr16 and latch circuits (Latch 1-5). The non-volatile semiconductor memory device 100 of this invention according to this embodiment is equipped with the latch circuit (Latch2) connected to node PDCo, and the latch circuit (Latch1) connected to node SDCo. They are provided in order to realize simultaneous write-in of an even/odd-bit lines, and retaining data for odd-bit lines.

Next, with reference to FIG. 9, the bit line potential holding circuits 110-1, 110-2 of this embodiment and the circuit configuration thereof are explained. FIG. 9 shows the bit line potential holding circuit 110-2 connected to the even-bit line BLeu. The bit line potential holding circuit 110-1 connected to the even-bit line BLeo is also the same circuit configuration. The bit line potential holding circuit 110-1 and 110-2 detect the potentials of even-bit lines, retain and hold the potentials, and they are desirably as much as small possible.

The bit line potential holding circuit 110-2 of this embodiment has a latch circuit 112 which consists of transmission gate transistor Tr1, two P channel type transistors Tr3 and Tr4, and two N channel type transistors Tr2 and Tr5 as they are shown in FIG. 9. ON and OFF of the transmission gate transistor Tr0 are controlled by SW1. Two power supplies of VDD (high potential) and VSS (low potential) are connected to the latch circuit 112. The potential of the even-bit line BLeu of the non-volatile semiconductor memory device 100 of this embodiment is of one from two potentials, VDD and VSS. If the potential of the even-bit line BLeu is at VDD when the transmission gate transistor Tr0 is turned on, the potential of the even-bit line BLeu is retained and held to VDD by the latch circuit 112. On the other hand, if the potential of the even-bit line BLeu is at VSS when the transmission gate transistor Tr0 is turned on, the potential of the even-bit line BLeu is retained and held to VSS by the latch circuit 112. Thus, the potential of the even-bit line BLeu is retained and held to VDD or VSS.

In this embodiment, the bit line potential holding circuit 110-1 and 110-2 described in FIG. 9 are used. However the bit line potential holding circuit used for the non-volatile semiconductor memory device 100 of this invention is not necessarily limited to this, and could be of FIG. 11.

Figure 11:
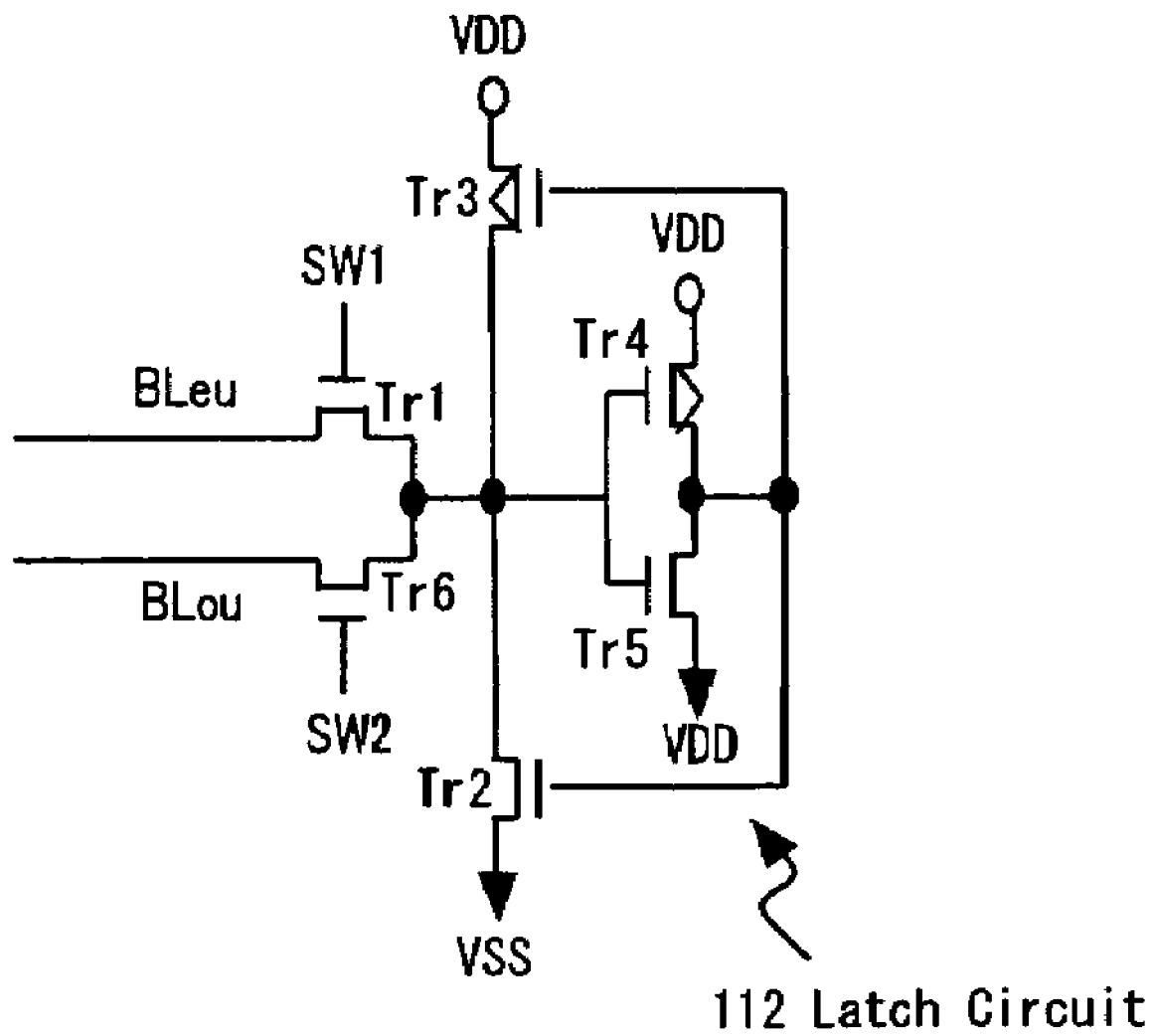
FIG. 11 is a circuit diagram of the bit line potential holding circuit of the non-volatile semiconductor memory device according to one embodiment of this invention.

The bit line potential holding circuit in FIG. 11 is connected to both of Even/Odd bit lines.

Figure 10:
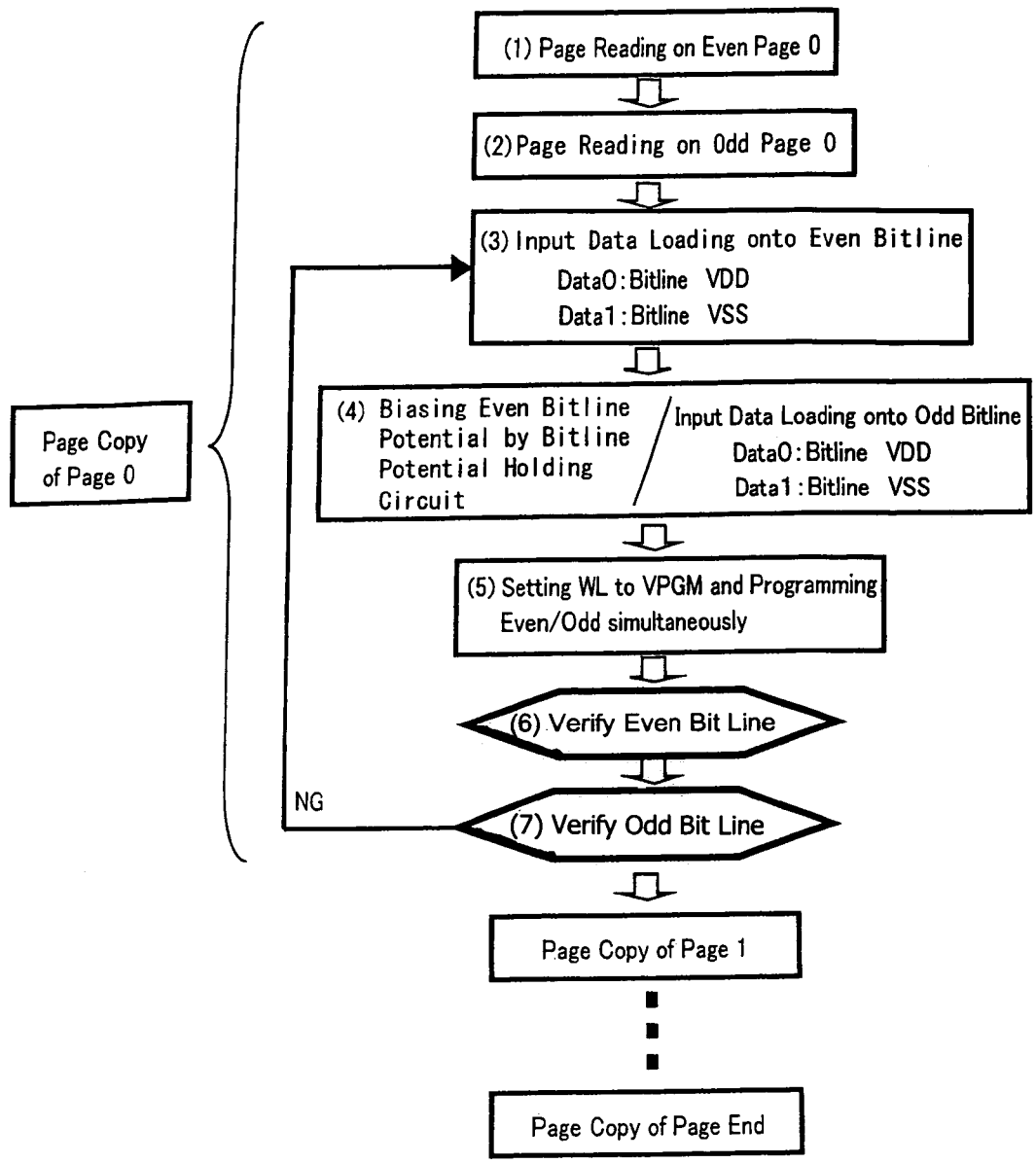
FIG. 10 is a flow chart of block copy operation of the non-volatile semiconductor memory device according to one embodiment of this invention.

Next, with reference to FIG. 10, block copy operation of the non-volatile semiconductor memory device 100 according to this embodiment is explained.

The page copy of Page0 is first performed as shown in FIG. 10. In the case of the page copy of Page0, (1) Even page data is first loaded to SDCe of the data cache 107 from exterior, and page read of Even Page0 is performed. Next, (2) Odd page data is loaded to SDCo of the data cache 107 from exteriors, and page read of Odd Page0 is performed. Then, (3) the data of SDCe is transmitted to PDCe, which turns on BLC1e, BLCLAMP, and BLSeu (turning on STr13, STr8, and STr5u), and data is loaded to Even bit lines. When data is "0", the potential of the Even bit lines will be at VDD, and on the other hand, when data is "1", the potential of the Even bit line will be at VSS. When the potentials of the Even bit lines are determined, the bit line potential holding circuit 110-2 operates. Next, (4) BLSeu is turned off (turning off STr5u) and the biasing for the potential of the Even bit lines are carried out from the bit line potential holding circuit 110-2, and the data of SDCo is transmitted to PDCo simultaneously. BLC1o, BLCLAMP, and BLSou are turned on (turning on STr11, STr8, and STr6u), and data is loaded to the Odd bit lines. When data is "0", the potentials of the Odd bit lines will be at VDD, and on the other hand, when data is "1", the potentials of the Odd bit lines will be VSS. Next, (5) a program voltage (VPGM) is supplied to the selected WL, and Even/Odd bit lines are written-in simultaneously. The bit lines of both Even/Odd are set at VSS, (6) verification on Even bit lines is performed, and the result is transmitted to PDCe/SDCe. Next, (7) verification of Odd bit lines is performed, and the result is transmitted to PDCo/SDCo. Then the Even/Odd bit lines will be completed if the program has completed for both. If it has not completed, it returns to operation of the above (3). Thus, the page copy of Page0 is completed.

Then, similar to the page copy of Page0, Then, from Page1 (Even Page1 and Odd Page1) to the page copy of Page End (Even PageEnd and Odd PageEnd) are performed sequentially. Thus, a block copy is performed. In the non-volatile semiconductor memory device of this embodiment, a series of above-mentioned operation is performed for memory block group D101-1 and memory block group D101-2.

Figure 13:
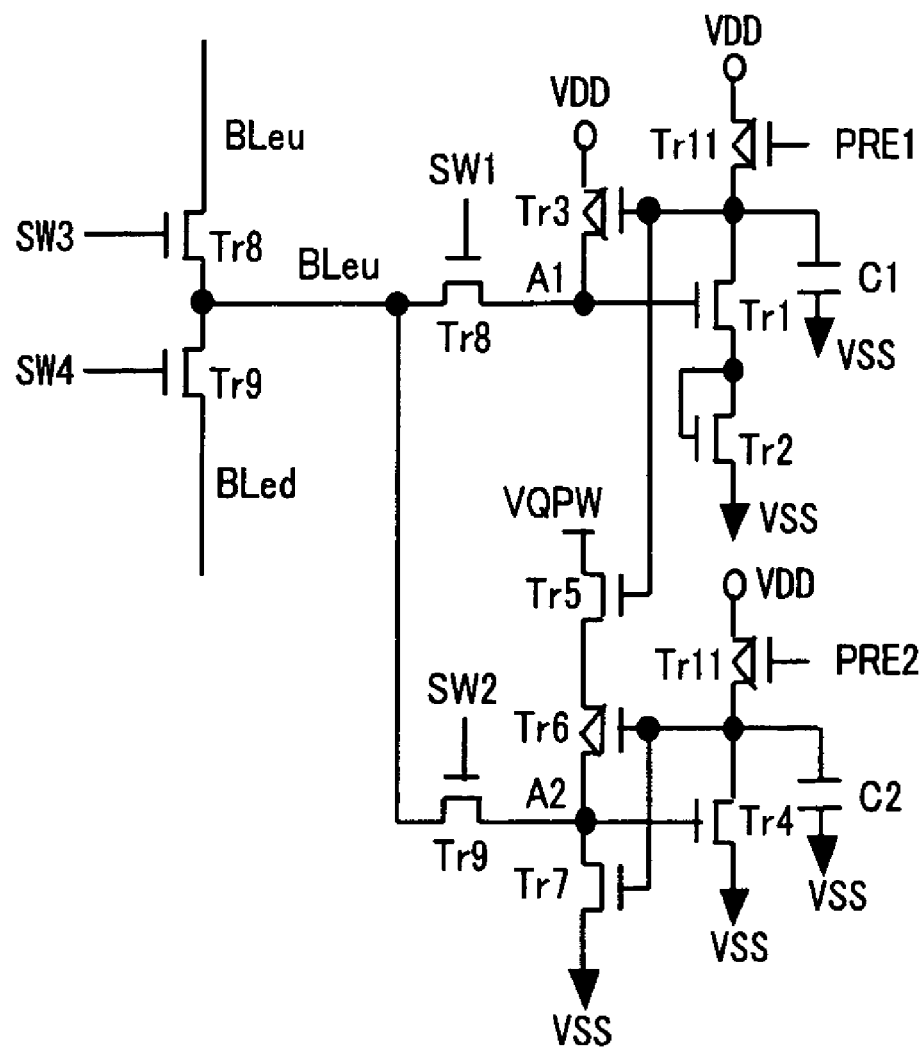
FIG. 13 is a circuit diagram of the bit line potential holding circuit of the non-volatile semiconductor memory device according to one embodiment of this invention.

In addition, as long as there is no problem on a circuit layout restrictions as mentioned above, single bit line potential holding circuit is arranged at the central part of bit lines, and two block groups (Memory block group D101-1 and memory block group U101-2) consisting of memory cells share single bit line potential holding circuit as similar to the data cache 107. In this case, the bit line potential holding circuit explained in FIG. 9 may be connected to the even-bit lines BLeu and BLed. Tr2 controlled by SW2 is provided, and therefore the potential of the even-bit lines BLeu is retained to turn on SW1, allowing to retain the potential of the even-bit line BLeo therefore to turn on SW2, as shown in FIG. 13.

In the non-volatile semiconductor memory device 100 of this embodiment, since NAND string length is 32, and it is divided into two memory block groups (memory block group D101-1 and memory block group U101-2) and even/odd-bit lines are for other pages, one block will consist of 128 pages. Since even/odd-bit lines are separately processed in the prior art at the time of write-in operation and reading operation, which results in 128 times of programming required for a block copy and 128 times of verifications. On the other hand, in the non-volatile semiconductor memory device 100 of this invention according to this embodiment, in a block copy, since it can write-in simultaneously into even/odd-bit lines, 64 times of programming and 128 times of verification are required. Thus, it can halve the number of programming compared with the prior art, and the improvement in the speed of a block copy can be attained.

Moreover, the non-volatile semiconductor memory device 100 of this invention according to this embodiment only requires two additional latches (Latch 1, Latch 2) at the ends of even-bit lines, and the bit line potential holding circuit to the data cache when comparing with the conventional one arranging the data cache on both sides of the bit line shown in Fig. Therefore, the simultaneous program of even/odd-bit lines can be realized, without increasing chip areas greatly.

Moreover, the non-volatile semiconductor memory device 100 of this invention according to this embodiment arranges a data cache in the central part of bit lines, and the up-and-down bit lines share said data cache. Therefore, the load capacitances of bit lines can be reduced by half, and improvement in the speed of a write-in speed and read-out speed can be attained.

Second Embodiment

Another example of the bit line potential holding circuit used for the non-volatile semiconductor memory device of this invention is explained in this second embodiment section.

Figure 12:
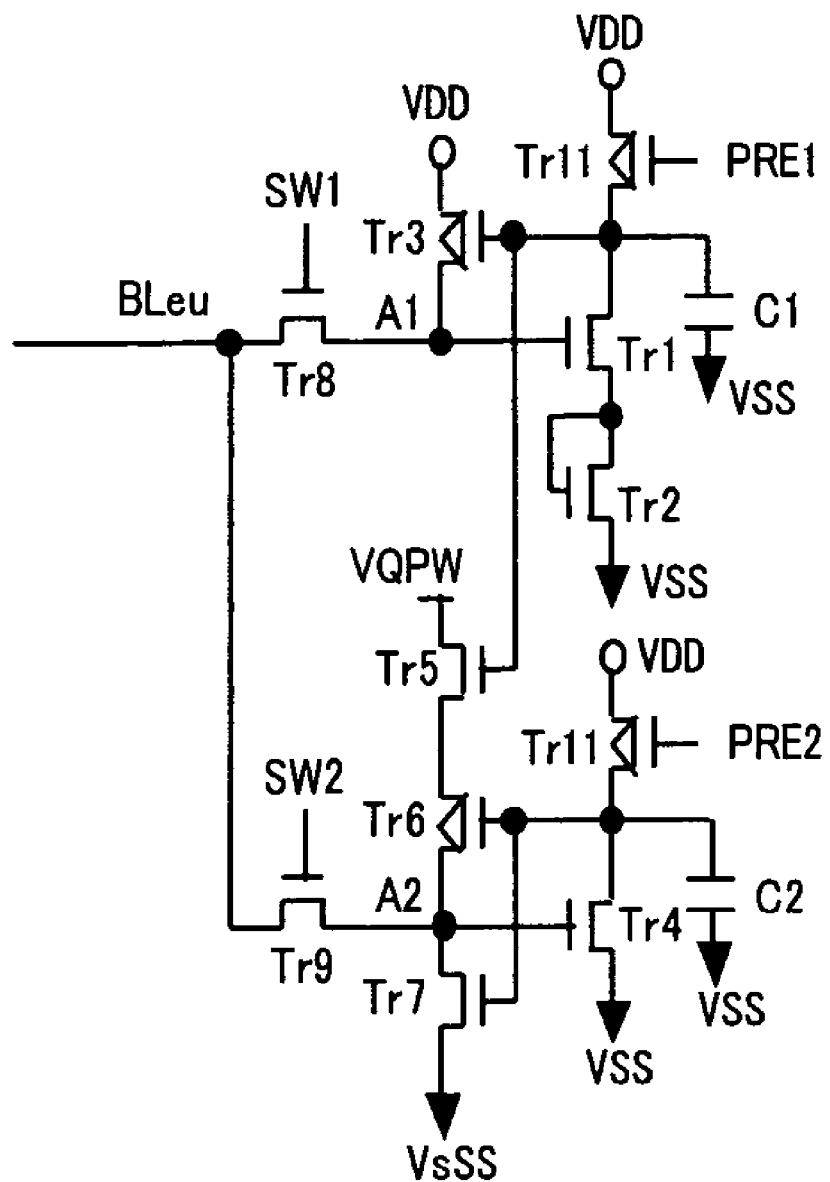
FIG. 12 is a circuit diagram of the bit line potential holding circuit of the non-volatile semiconductor memory device according to one embodiment of this invention.

The bit line potential holding circuit of this embodiment is shown in FIG. 12. In the bit line potential holding circuit of this embodiment, the potential level of even-bit lines are supplied with three different voltages such as VDD, VSS, and VQPW (intermediate voltage, for example, 1V), which is higher than VSS and lower than VDD. This intermediate voltage VQPW is used in order to narrow threshold voltage distribution of memory cells. In the program operation of memory cells, when the threshold voltages of the memory cells are far away from a predetermined threshold voltage, it is necessary to shift the threshold voltages of the memory cells for a large amount. On the other hand, when the threshold voltages of the memory cells are close to the predetermined threshold voltage, it is desirable to make small shift of the threshold voltage of the memory cells. In order to make small shifting of the threshold of the memory cells, the potentials of the bit lines connected to the memory cells for small shifting of threshold voltage are raised from VSS to the intermediate voltage VQPW (1V).

The bit line potential holding circuit of this embodiment has seven N channel type transistors Tr1, Tr2, Tr4, Tr5, Tr7 and Tr8, four P channel type transistors Tr3, Tr6, Tr10 and Tr11, and capacitors C1 and C2 as shown in FIG. 12. Moreover, the bit line potential holding circuit of this embodiment is connected to VDD, VSS, and VQPW that is the intermediate voltage of VDD-VSS.

Next, operation of the bit line potential holding circuit of this embodiment is explained. (1) PRE1 and PRE2 are raised to turn on Tr10 and Tr11, and capacitances C1 and C2 are charged to VDD. (2) SW1 and SW2 are raised to turn on Tr8 and Tr9, and the potential of the even-bit line BLeu is transmit to nodes A1 and A2.

Here, when the potential of the even-bit line BLeu is at VDD, the potential of the node A1 will be VDD, Tr1 and Tr2 turn on, a capacitance C1 is discharged and transistor Tr3 turns on. Since the potential of the node A2 is also at VDD, Tr4 turns on, a capacitance C2 is discharged and, Tr7 turns off and Tr5 turns on. Therefore, the even-bit line BLeu is retained and held to VDD with Tr3 turning on.

When the potential of the even-bit line BLeu is at VSS, the potential of the node A1 will be at VSS, transistor Tr1 turns off, and a capacitance C1 is not discharged, but Tr3 turns off. Since the potential of the node A2 is also at VSS, Tr4 turns off, and a capacitance C2 is not discharged, but Tr7 turns on. Therefore, the potential of the even-bit line Bleu is retained and held to VSS with Tr7 turning on.

When the potential of the even-bit line BLeu is VQPW (for example, 1V), the potential of the node A1 is set to 1V, Tr1 turns on, Tr2 turns off, a capacitance C1 is not discharged, and Tr3 turns off. The potential of the node A2 is also set to 1V, Tr4 turns on, a capacitance C2 is discharged, Tr6 turns on, and Tr5 turns on. Therefore, the even-bit line BLeu is retained and held to VQPW (1V) with Tr5 and Tr6 turning on.

Thus, the potential can be retained and held by the bit line potential holding circuit of this embodiment, even if even-bit lines are at any of VDD, VSS, and intermediate voltage.

As long as there is no problem in circuit layout restriction as explained in the above-mentioned embodiment, similar to the data cache 107, single bit line potential holding circuit may be arranged to at the central part of bit lines, and two block groups (memory block group D101-1 and memory block group U101-2) consisting of memory cells may share the single bit line potential holding circuit. In this case, the bit line potential holding circuit explained in FIG. 12 may be connected to the even-bit lines BLeu and Bled. As shown in FIG. 13, Tr12 and Tr2 which are controlled by SW3 and SW4, respectively may be provided, and the potential of the even-bit line BLeu may be retained by turning on SW3, and, therefore, the potential of the even-bit line Bled may be retained by turning on SW4.

The non-volatile semiconductor memory device of this invention using the bit line data holding circuit in this embodiment can perform the simultaneous program of even/odd-bit lines, without increasing chip areas greatly as compared with the prior arts, even if it is a case where the potential level of a bit line is of three different levels. Therefore, the number of program cycles can be halved, and improvement in the speed of a block copy can be realized.

Third Embodiment

Figure 14:
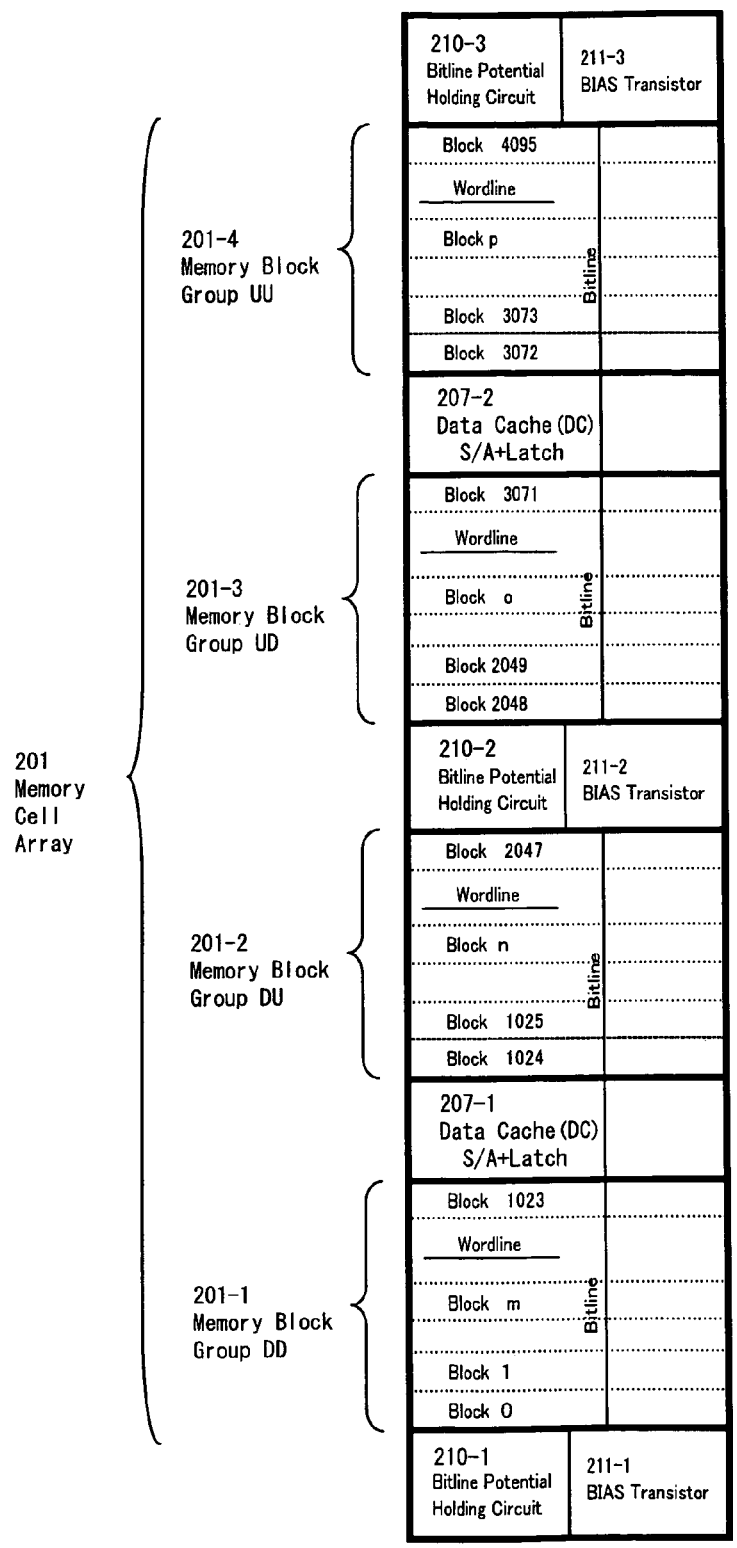
FIG. 14 is a circuit block diagram of the periphery of the memory cell array of the non-volatile semiconductor memory device according to one embodiment of this invention.

In this embodiment, non-volatile semiconductor memory device of this invention having four memory-block-groups and for sharing some bit line holding circuits is explained. FIG. 14 is referred to. The circuit block diagram of the periphery of the memory cell ara of the non-volatile semiconductor memory device of this invention is shown in FIG. 14.

The memory cell array 201 of the non-volatile semiconductor memory device of this embodiment has a memory block group DD201-1 which consists of block 0-block 1023, and a memory block group DU201-2 which consists of block 1024-block 2047. Furthermore, the memory cell array 201 has a memory block group UD201-3 which consists of block 2048-block 3071, and a memory block group UU201-4 which consists of block 3072-block 4095. In one of the memory block, the string length of the NAND memory cell is 32 (WL0-WL31), and the page length (the number of bit lines) is 2 K bytes. In addition, the number of memory blocks in the non-volatile semiconductor memory device 100 of this invention, the string length and the page length of the NAND memory cells are not necessarily limited to the number of this embodiment, and should be changed according to storage capacities.

In this embodiment, the memory block group DD201-1 and the memory block group DU201-2 share single data cache 207-1, and the memory block group UD201-3 and the memory block group UU201-4 share single data cache 207-2. With the above configuration, the capacitances of the bit lines are halved as compared with the conventional example with the data caches at the both ends of bit lines. The bit line potential holding circuit 210-1 for retaining and holding potentials is connected to the even-bit line of the memory block group DD201-1, and the BIAS transistor 211-1 is connected to the odd-bit lines. The bit line potential holding circuit 210-2 for retaining and holding potentials is connected to the even-bit lines of the memory block group DD201-2, and the even-bit lines of the memory block group DD201-3. The BIAS transistor 211-2 is connected to the odd-bit lines. That is, the memory block group DD201-2 and the memory block group DD201-3 share single bit line potential holding circuit 210-2 and single BIAS transistor 211-2. Furthermore, the bit line potential holding circuit 210-3 for retaining and holding those potentials is connected to the even-bit lines of the memory block group DD201-4, and the BIAS transistor 211-3 is connected to the odd-bit lines.

Thus, in the non-volatile semiconductor memory device of this embodiment, two data caches, three bit line potential holding circuits, and three BIAS transistors are provided for four memory block groups. Therefore, even for enlarged memory capacity and increased number of block groups, two block groups share single bit line potential holding circuit and a BIAS transistor, and increase of area can be suppressed.

The non-volatile semiconductor memory device of this invention can realize an improvement in the speed of the block copy which was a bottleneck before, and can realize improvement in the speed of the whole system of a NAND type flash memory without increasing chip areas greatly. Therefore, this invention enables cheaper and small sized, high speed, and large capacity non-volatile semiconductor memory device. The non-volatile semiconductor memory device of this invention can be used for memory storage of electric devices such as computers, digital cameras, cellular phones, and home electronics.

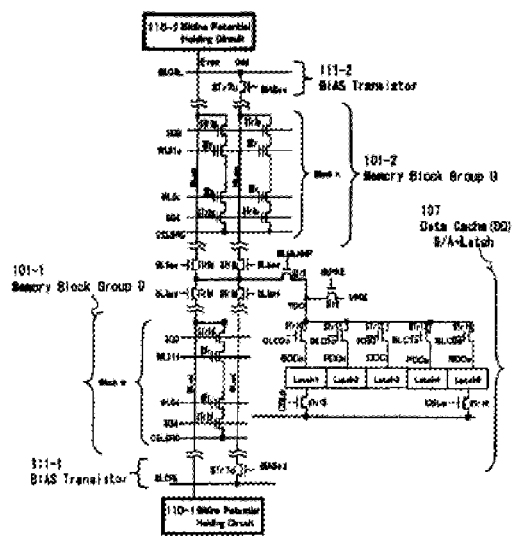

What is claimed is:

1. A non-volatile semiconductor memory device comprising
   a first bit line connected to a first memory cell;
   a second bit line connected to a second memory cell, the second bit line being adjacent to said first bit line;
   a bit line shielding circuit, for providing a predetermined shield potential to said second bit line when said first memory cell connected to said first bit line is sensed and for providing said predetermined shield potential to said first bit line when said second memory cell connected to said second bit line is sensed;
   a data cache circuit for sequentially providing a first data to said first bit line and a second data to said second bit line;
   a bit line potential holding circuit for holding said first data provided to said first bit line at the time of programming said first memory cell and said second memory cell; and
   a program circuit for simultaneously programming said first memory cell and said second memory cell while said bit line potential holding circuit holds said first data provided to said first bit line and while the data cache is providing the second data to said second bit line.

2. The non-volatile semiconductor memory according to claim 1 wherein said bit line potential holding circuit has a latch circuit connected to said first bit line.

3. The non-volatile semiconductor memory according to claim 2 further comprising a first connection transistor connected between said latch circuit of said bit line potential holding circuit and said first bit line.

4. The non-volatile semiconductor memory according to claim 3 further comprising a second connection transistor connected between said latch circuit of said bit line potential holding circuit and said second bit line.

5. The non-volatile semiconductor memory device according to claim 1 wherein said first data provided by said data cache circuit is at one of three levels of a high level, a low level or an intermediate level which is between the high level and the low level, and said bit line potential holding circuit holds said first bit line at any one of said three levels.

6. A non-volatile semiconductor memory device comprising:
   a first circuit for sequentially loading data to a first bit line and a second bit line adjacent to said first bit line, said first circuit being connected to one ends of said first bit line and said second bit line;
   a second circuit for holding a potential of said first bit line, said second circuit being connected to the other end of said first bit line at the time of pro gramming memory cells connected to the first bit line and the second bit line; and
   a program circuit for programming in memory cells connected to the first bit line and the second bit line simultaneously after said second circuit holds the potential of said first bit line and a potential of said second bit line is maintained.

7. The non-volatile semiconductor memory device according to claim 6 wherein said second circuit holds the first bit line with an intermediate voltage higher than VSS and lower than VDD.

8. The non-volatile semiconductor memory device according to claim 7 wherein said intermediate voltage is held by said second circuit when programming with smaller threshold voltage shifting is performed to memory cells connected to said first bit line.

9. A non-volatile semiconductor memory device comprising:
   a first memory block consisting of a plurality of first memory cells arranged in matrix, first even bit lines, and first odd bit lines adjacent to the first even bit lines;
   a second memory block consisting of a plurality of second memory cells arranged in matrix, second even bit lines, and second odd bit lines adjacent to the second even bit lines;
   a first data cache arranged between said first memory block and said second memory block for loading data to said first and second even bit lines and first and second odd bit lines; and
   a first bit line potential holding circuit for holding first data at one of said first even bit lines or said first odd bit lines.

10. The non-volatile semiconductor memory device according to claim 9 further comprising a second bit line potential holding circuit for holding second data at one of said second even bit lines or said second odd bit lines.

11. The non-volatile semiconductor memory device according to claim 9 wherein said first bit line potential holding circuit is arranged at an opposite end of said first memory block to said first data cache.

12. The non-volatile semiconductor memory device according to claim 10 wherein said first bit line potential holding circuit is arranged at an opposite end of said first memory block to said first data cache; and said second bit line potential holding circuit is arranged at an opposite end of said second memory block to said first data cache.

13. The non-volatile semiconductor memory device according to claim 9 wherein said first bit line potential holding circuit is located between said first memory block and said second memory block and further holds said second data at one of said second even bit line or said second odd bit line.

14. The non-volatile semiconductor memory device according to claim 13 further comprising:

a circuit for biasing located between said first memory block and said second memory block and for biasing said first even or odd bit lines and said second even or odd bit lines.

15. The non-volatile semiconductor memory device according to claim 9 further comprising:
   a third memory block consisting of a plurality of third memory cells arranged in matrix, third even bit lines, and third odd bit lines adjacent to the third even bit lines;
   a fourth memory block consisting of a plurality of fourth memory cells arranged in matrix, fourth even bit lines, and fourth odd bit lines adjacent to the fourth even bit lines;
   a second data cache arranged between said third memory block and said fourth memory block for loading data to said third and fourth even bit lines and third and fourth odd bit lines;
   a second bit line potential holding circuit for holding second data at one of said second even bit lines or said second odd bit lines, and for holding third data at one of said third even bit lines or said third odd bit lines; and
   a third bit line potential holding circuit for holding fourth data at one of said fourth even bit lines or said fourth odd bit lines.

16. The non-volatile semiconductor memory device according to claim 15 wherein said first bit line potential holding circuit is arranged at an opposite end of said first memory block to said first data cache; said second bit line potential holding circuit is arranged between said second and third memory blocks; said third bit line potential holding circuit is arranged at an opposite end of said fourth memory block to said second data cache.

17. The non-volatile semiconductor memory device according to claim 11 further comprising a first bias circuit arranged in adjacent to said first bit line potential holding circuit for biasing said first even bit lines or said first odd bit lines.

18. The non-volatile semiconductor memory device according to claim 16 further comprising:
   a first bias circuit arranged in adjacent to said first bit line potential holding circuit for biasing said first even bit lines or said first odd bit lines;
   a second bias circuit arranged in adjacent to said second bit line potential holding circuit for biasing said second and third even bit lines or said second and third odd bit lines; and
   a third bias circuit arranged in adjacent to said third bit line potential holding circuit for biasing said fourth even bit lines or said fourth odd bit lines.

* * * * *

UNITED STATES PATENT AND TRADEMARK OFFICE
CERTIFICATE OF CORRECTION

| | |
|---|---|
| PATENT NO. | : 7,327,616 B2 |
| APPLICATION NO. | : 11/235206 |
| DATED | : February 5, 2008 |
| INVENTOR(S) | : Yasushi Kameda et al. |

Page 1 of 1

It is certified that error appears in the above-identified patent and that said Letters Patent is hereby corrected as shown below:

Delete Claims 6-18.

Signed and Sealed this

Thirty-first Day of March, 2009

JOHN DOLL
*Acting Director of the United States Patent and Trademark Office*

UNITED STATES PATENT AND TRADEMARK OFFICE
CERTIFICATE OF CORRECTION

| | |
|---|---|
| PATENT NO. | : 7,327,616 B2 |
| APPLICATION NO. | : 11/235206 |
| DATED | : February 5, 2008 |
| INVENTOR(S) | : Yasushi Kameda et al. |

It is certified that error appears in the above-identified patent and that said Letters Patent is hereby corrected as shown below:

Delete the title page and substitute therefore the attached title page.

Column 12, line 3 - Column 14, line 26, delete claims 6-18.

This certificate supersedes the Certificate of Correction issued March 31, 2009.

Signed and Sealed this

Twenty-first Day of April, 2009

JOHN DOLL
*Acting Director of the United States Patent and Trademark Office*

United States Patent
Kameda et al.

(10) Patent No.: US 7,327,616 B2
(45) Date of Patent: Feb. 5, 2008

(54) NON-VOLATILE SEMICONDUCTOR MEMORY DEVICE

(75) Inventors: Yasushi Kameda, Yokosuka (JP); Ken Takeuchi, Yokohama (JP); Hitoshi Shiga, Yokohama (JP); Takuya Futatsuyama, Yokohama (JP); Koichi Kawai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/235,206

(22) Filed: Sep. 27, 2005

(65) Prior Publication Data

US 2006/0087887 A1 Apr. 27, 2006

(30) Foreign Application Priority Data

Sep. 30, 2004 (JP) ............................. 2004-288449

(51) Int. Cl.
*G11C 5/14* (2006.01)
(52) U.S. Cl. .................... 365/189.09; 365/185.18
(58) Field of Classification Search ............. 365/49, 365/189.09
See application file for complete search history.

(56) References Cited

U.S. PATENT DOCUMENTS

| | | | |
|---|---|---|---|
| 5,150,325 A * | 9/1992 | Yanagisawa et al. | 365/177 |
| 5,453,955 A | 9/1995 | Sakui et al. | |
| 5,459,694 A * | 10/1995 | Arakawa | 365/185.21 |
| 5,802,602 A * | 9/1998 | Rahman et al. | 711/204 |
| 2003/0117856 A1* | 6/2003 | Lee et al. | 365/189.05 |
| 2004/0213045 A1* | 10/2004 | Nakai | 365/185.13 |
| 2006/0087887 A1 | 4/2006 | Kameda et al. | |

FOREIGN PATENT DOCUMENTS

| | | |
|---|---|---|
| JP | 4-276393 | 10/1992 |
| JP | 09-35486 | * 7/1995 |
| JP | 08-147990 | * 11/1995 |
| JP | 8-147990 | 6/1996 |
| JP | 9-35486 | 2/1997 |

OTHER PUBLICATIONS

U.S. Appl. No. 11/235,206, filed Sep. 27, 2005, Kameda et al.
U.S. Appl. No. 11/240,510, filed Oct. 3, 2005, Nagashima.
U.S. Appl. No. 11/409,043, filed Apr. 24, 2006, Takeuchi.

* cited by examiner

*Primary Examiner*—Amir Zarabian
*Assistant Examiner*—Jason Lappas
(74) *Attorney, Agent, or Firm*—Oblon, Spivak, McClelland, Maier & Neustadt, P.C.

(57) ABSTRACT

The non-volatile semiconductor memory device has a circuit which maintains and holds the potentials of bit lines, and either ones of even-bit lines or odd-bit lines are connected to the circuit. When the bit line potential holding circuit is connected to even-bit lines and a block copy is performed, data is first outputted to the even-bit lines, and after the potential of the even-bit line is determined, the bit line potential holding circuit operates. Then, biasing of the potential of the even-bit lines is carried out by the bit line potential holding circuit, the potentials of the bit lines are maintained and held. At the same time, data is outputted to the odd-bit lines and the potentials of the odd-bit lines are determined. Then, a program voltage is supplied to a selected word line, and data is simultaneously written (programmed) in the memory cells connected to the even-bit lines, and the memory cells connected to the odd-bit lines.

5 Claims, 14 Drawing Sheets